(12) United States Patent
Fritz et al.

(10) Patent No.: US 10,547,268 B2
(45) Date of Patent: Jan. 28, 2020

(54) SERIALIZER-DESERIALIZER FOR MOTOR DRIVE CIRCUIT

(71) Applicant: TEXAS INSTRUMENTS INCORPORATED, Dallas, TX (US)

(72) Inventors: Tobias Bernhard Fritz, Mainburg (DE); Martin Staebler, Freising (DE); Baher Haroun, Allen, TX (US); Peter Fundaro, Dallas, TX (US); Jiri Panacek, Freising (DE); Ralf Peter Brederlow, Poing (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 15/858,485

(22) Filed: Dec. 29, 2017

(65) Prior Publication Data

US 2018/0278195 A1 Sep. 27, 2018

Related U.S. Application Data

(60) Provisional application No. 62/477,116, filed on Mar. 27, 2017.

(51) Int. Cl.
| | |
|---|---|
| *H04L 5/14* | (2006.01) |
| *H02P 27/08* | (2006.01) |
| *H02M 3/157* | (2006.01) |
| *H04L 7/033* | (2006.01) |
| *H03M 9/00* | (2006.01) |
| *H04Q 11/02* | (2006.01) |
| *H04L 7/06* | (2006.01) |

(52) U.S. Cl.
CPC .......... *H02P 27/085* (2013.01); *H02M 3/157* (2013.01); *H03M 9/00* (2013.01); *H04L 7/033* (2013.01); *H04L 7/06* (2013.01); *H04Q 11/02* (2013.01); *H04Q 2213/13036* (2013.01)

(58) Field of Classification Search
CPC ....... H02P 27/085; H04Q 11/04; H04Q 11/02; H04Q 2213/036; H04Q 2213/13036; H03M 9/00; H02M 3/157; H04L 7/033; H04L 7/06
USPC ....................................................... 370/295
See application file for complete search history.

(56) References Cited

U.S. PATENT DOCUMENTS

| | | | |
|---|---|---|---|
| 7,184,466 B1 * | 2/2007 | Seemann ............. | H04B 1/0003 375/219 |
| 7,230,956 B1 | 6/2007 | Ambrose et al. | |
| (Continued) | | | |

*Primary Examiner* — Chuong T Ho
(74) *Attorney, Agent, or Firm* — Michael A. Davis, Jr.; Charles A. Brill; Frank D. Cimino

(57) ABSTRACT

A motor drive circuit includes a first serializer-deserializer (SER-DES) module that converts first SER-DES input signals into a first SER-DES output serial data stream. The first SER-DES input signals relate to motor control inputs or motor drive power outputs. A second SER-DES module converts a second SER-DES input serial data stream corresponding to the first SER-DES output serial data stream into second SER-DES output signals. The second SER-DES input signals relate to motor drive power outputs or motor control inputs. A serial isolation channel provides a galvanic isolation barrier between the first SER-DES module and the second SER-DES module. The serial isolation channel communicates the first SER-DES output serial data stream across the galvanic isolation barrier to provide the second SER-DES input serial data stream.

23 Claims, 9 Drawing Sheets

(56) References Cited

U.S. PATENT DOCUMENTS

| | | |
|---|---|---|
| 2003/0081782 A1 | 5/2003 | Coles |
| 2010/0201188 A1* | 8/2010 | Robbins .................. H04L 12/10 307/1 |
| 2011/0038286 A1* | 2/2011 | Ta .......................... H04Q 11/02 370/295 |
| 2014/0307759 A1* | 10/2014 | Sundar .................... H04B 1/40 375/219 |
| 2015/0131643 A1* | 5/2015 | Oren ....................... H04L 69/08 370/338 |
| 2016/0188395 A1* | 6/2016 | Buehler .................. H03M 9/00 714/807 |
| 2016/0295221 A1 | 10/2016 | Altmann et al. |
| 2017/0093715 A1 | 3/2017 | McGhee et al. |
| 2018/0191049 A1* | 7/2018 | Kamgaing .............. H01P 3/122 |

\* cited by examiner

SERIALIZER-DESERIALIZER FOR MOTOR DRIVE CIRCUIT

CROSS-REFERENCE TO RELATED APPLICATION

This application claims the benefit of U.S. Provisional Patent Application No. 62/477,116 filed Mar. 27, 2017, entitled New Isolator Topologies for 3-Phase Motor Drives Applications, the entirety of which is incorporated by reference herein.

TECHNICAL FIELD

This relates generally to electrical circuits, and more particularly to serializer-deserializer (SER-DES) modules for communicating signals between a motor controller module and a motor drive power module.

BACKGROUND

A motor controller is a device, circuit or system that governs, in some predetermined manner, the performance of an electric motor. For example, in three-phase alternating current (AC) motors, separate phase windings of the motors are controlled and timed, such that one phase is activated as another phase is deactivated, in order to cause the motor to rotate properly. The motor controller is usually coupled to a motor power module to drive the individual phases of the motor. In some examples, the motor controller module is electrically isolated from the motor power module via isolation circuits (e.g., isolated gate drivers) that couple the respective controller and power modules. In the example of a three-phase motor system (including a high-side and low-side driver and phase current and optional phase voltage sensors for each phase of the motor), if full isolation is required between each driver, then twelve isolation circuits would be provided to isolate each driver and current sensor from one another and common circuit paths (such as ground). To fabricate respective controller and power module interfaces, a higher cost is incurred to individually isolate the driver circuits and current/voltage sensors and associated control signals to control and monitor the motor.

SUMMARY

In one example, a motor drive circuit includes a first serializer-deserializer (SER-DES) module that converts first SER-DES input signals into a first SER-DES output serial data stream. The first SER-DES input signals relate to motor control inputs or motor drive power outputs. A second SER-DES module converts a second SER-DES input serial data stream corresponding to the first SER-DES output serial data stream into second SER-DES output signals. The second SER-DES input signals relate to motor drive power outputs or motor control inputs. A serial isolation channel provides a galvanic isolation barrier between the first SER-DES module and the second SER-DES module. The serial isolation channel communicates the first SER-DES output serial data stream across the galvanic isolation barrier to provide the second SER-DES input serial data stream.

In another example, a motor drive system includes a motor controller module having motor controller outputs and motor controller inputs. The system includes a motor drive power module having motor drive power outputs and motor drive power inputs. A first serializer-deserializer (SER-DES) module converts a first SER-DES input serial data stream into first SER-DES output signals, and/or the first SER-DES module converts first SER-DES input signals into a first SER-DES output serial data stream. The first SER-DES output signals drive the motor controller inputs of the motor controller module and the first SER-DES input signals are driven from the motor controller outputs of the motor controller module. A second SER-DES module converts a second SER-DES input serial data stream into second SER-DES output signals, and/or the second SER-DES module converts second SER-DES input signals into a second SER-DES output serial data stream. The second SER-DES output signals drive the motor drive power inputs of the motor drive power module and the second SER-DES input signals are driven from the motor drive power outputs of the motor drive power module. A serial isolation channel provides a galvanic isolation barrier between the first SER-DES module and the second SER-DES module. The serial isolation channel communicates the first SER-DES output serial data stream in one direction across the galvanic isolation barrier to provide the second SER-DES input serial data stream. The serial isolation channel communicates the second SER-DES output serial data stream in another direction across the galvanic isolation barrier to provide the first SER-DES input serial data stream.

In yet another example, a method includes converting a first SER-DES input serial data stream into first SER-DES output signals. The method includes converting first SER-DES input signals into a first SER-DES output serial data stream. The method includes converting a second SER-DES input serial data stream into second SER-DES output signals. The method includes converting second SER-DES input signals into a second SER-DES output serial data stream. This includes coupling the first SER-DES output serial data stream to the second SER-DES input serial data stream across a first galvanic isolation barrier to communicate control signals from a motor controller module to a motor drive power module to control a motor. The method includes coupling the second SER-DES output serial data stream to the first SER-DES input serial data stream across a second galvanic isolation barrier to communicate feedback signals to the motor controller module from the motor drive power module relating to status of the motor.

DETAILED DESCRIPTION

Figure 1:
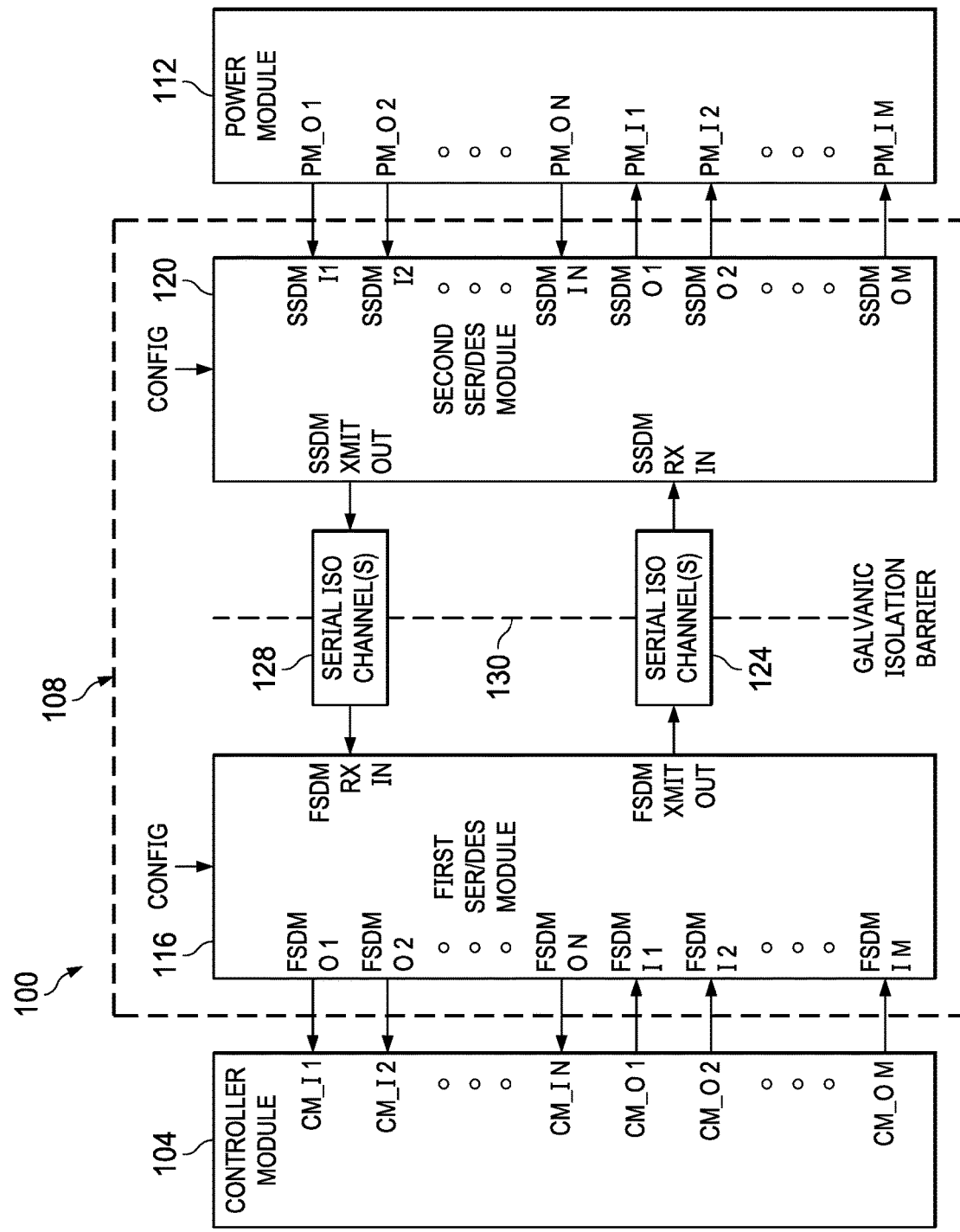
FIG. 1 illustrates an example system to convert controller and power signals of a motor drive circuit to serial signals.

This description relates to serializer-deserializer systems and methods, such as for communicating controller and power signals of a motor drive circuit. Parallel signals can be grouped and serialized into a serial data stream at one end of the motor drive circuit and de-serialized into parallel signals at the other end, in order reduce isolation circuits between a motor controller module and a motor drive power module. For example, a separate serial-deserializer (SER-DES) module can be coupled respectively to the motor controller module and the motor drive power module, where the respective SER-DES module converts parallel signals from each of the modules into serial data streams, which are multiplexed (e.g., via time-division or frequency division multiplexing) to maintain synchronization between the controller and the power module.

Parallel signals can be classified according to an isolation domain in order to determine parallel signal groupings that can be multiplexed into a serial data stream at one end and de-multiplexed at the other end. For the example of a multi-phase motor, an isolation domain is defined by the signals that drive the motor, where each phase of the motor can include a high-side drive signal and a low-side drive signal to control the respective phase. In the example of a three-phase motor, two isolation domains can be specified per phase providing up to six isolation domains in three-phase inverters for motor drives. Isolation domains can also be extended to multilevel inverters with more than two switches per half-bridge. For example, a three-level neutral point clamped (NPC) inverter includes four switches in series per half-bridge which can similarly be supported. Each isolation domain may encompass multiple independent isolation channels (e.g. gate driver control signals, feedback signals from analog or digital current and voltage sensors for a given high or low side circuit that drives a motor phase). The isolation channels are expensive and use a fixed amount of board area for isolation requirements to provide safety spacing. The SER-DES module described herein enables a single (or reduced number) of isolation channels compared to many existing approaches. The approach herein further simplifies design of an isolated three-phase inverter power stage, reduces both silicon cost and PCB board space, and therefore reduces overall system cost of an isolated three-phase inverter.

The number of isolation channels can be reduced by grouping signals which share the same isolation domain within a multi-phase inverter system. The signals in each of the groups are multiplexed, passed through a reduced number of high speed isolated channels and then de-multiplexed again via the SER-DES modules. This grouping of signals allows new isolator integrated circuit topologies for isolated three-phase inverters, which enable smaller footprint and lower-cost multi-phase inverter designs.

The SER-DES modules can be configured to provide grouping and structuring for the signaling of the individual isolation domains by coupling to an isolation barrier for each of the different domains. A centralized isolation barrier per domain allows the end user to use lower-cost non-isolated gate drivers, analog-to-digital converter (ADC), or sensor frontends while fulfilling similar isolation requirements at lower system cost and less board space. Furthermore, the SER-DES modules limit the isolation components and therefore reduce silicon manufacturing cost for each circuit.

As used herein, the term "circuit" can include a collection of active and/or passive elements that perform a circuit function, such as an analog circuit or control circuit. Additionally or alternatively, for example, the term "circuit" can include an integrated circuit (IC) where all and/or some of the circuit elements are fabricated on a common substrate (e.g., semiconductor substrate, such as a die or chip).

FIG. 1 illustrates an example serializer-deserializer (SER-DES) system 100 to convert communicate controller and power signals of a motor drive circuit. The system 100 includes a motor controller module 104 having motor controller outputs shown as CM_O1 through CM_OM and motor controller inputs shown as CM_I1 through CM_IN, where N and M are positive integers. In some examples, N and M can be the same integer, and in other examples, N and M can be different. The motor controller module 104 communicates with a motor drive power module 112 via a motor drive communication circuit 108. The motor drive power module 112 includes motor drive power outputs shown as PM_O1 through PM_ON and motor drive power inputs shown as PM_I1 through PM_IM.

Example outputs of the motor controller module 104 include pulse width modulated (PWM) drive signals to drive high and low-side drivers of a three-phase motor and clock signals to be used by power module ADC circuits that digitize motor feedback information such as phase current detected in a given winding of the three-phase motor. One or more groupings (e.g., sets) of the outputs from the motor controller module 104 can be serialized and de-serialized by the motor drive communication circuit 108 and received by the motor drive power module 112 as inputs to control the three-phase motor. Additionally or alternatively, one or more groupings of outputs from the motor drive power module 112 can be serialized and de-serialized by the motor drive communication circuit 108 and received by the controller module 104 as inputs. Example outputs from the power module 112 can include serial analog-to-digital (ADC) signals representing phase current and/or voltage, diagnostic information including phase fault status and motor power status.

The motor drive communication circuit 108 includes a first SER-DES module 116 that converts a first SER-DES input serial data stream (FSDM RX IN) into first SER-DES output signals (FSDM O1 through FSDM ON) which in turn drive the inputs of the motor controller module 104. Additionally or alternatively, the first SER-DES module 116 converts first SER-DES input signals (FSDM I1 through FSDM IM) into a first SER-DES output serial data stream (FSDM XMIT OUT). As shown, the first SER-DES output signals (FSDM O1 through FSDM ON) are associated with motor controller inputs and the first SER-DES input signals (FSDM I1 through FSDM IM) are associated with motor controller outputs.

A second SER-DES module 120 converts a second SER-DES input serial data stream (SSDM RX IN) into second SER-DES output signals (SSDM O1 through SSDM OM), which provide corresponding inputs the power module 112.

Additionally or alternatively, the second SER-DES module 120 converts second SER-DES input signals (SSDM I1 through SSDM IN) into a second SER-DES output serial data stream (SSDM XMIT OUT). The second SER-DES output signals (SSDM O1 through SSDM OM) are associated with motor drive power inputs and the second SER-DES input signals (SSDM I1 through SSDM IN) are associated with motor drive power outputs. Each of the SER-DES modules 116 and 120 can include a configuration input (CONFIG) which allows a user to program which connections of the motor controller module 104 and the motor drive power module 112 are connected to the respective SER-DES modules as inputs or outputs.

One or more serial isolation channels 124 and 128 provide communication through a galvanic isolation barrier 130 between the first SER-DES module 116 and the second SER-DES module 120. The serial isolation channel 124 communicates the first SER-DES output serial data stream (FSDM XMIT OUT) in one direction across the galvanic isolation barrier 130 to provide the second SER-DES input serial data stream (SSDM RX IN). The serial isolation channel 128 communicates the second SER-DES output serial data stream (SSDM XMIT OUT) in another direction across the galvanic isolation barrier 130 to provide the first SER-DES input serial data stream (FSDM RX IN). The isolation channels 124 and 128 can include substantially any type circuit that allows communication of signals from one side of the galvanic isolation barrier 130 to the other without also sharing common direct current (DC) paths, such as ground. Example isolation channels can include capacitive isolators, transformers, Hall effect isolators and optical isolators. The first and second SER-DES modules 116 and 120 and the serial isolation channels 124 and 128 can be implemented on an integrated circuit substrate in one example or a printed circuit board substrate in another example. Other example aspects of the respective SER-DES modules is illustrated and described hereinbelow with respect to FIG. 2.

Figures 2, 3:
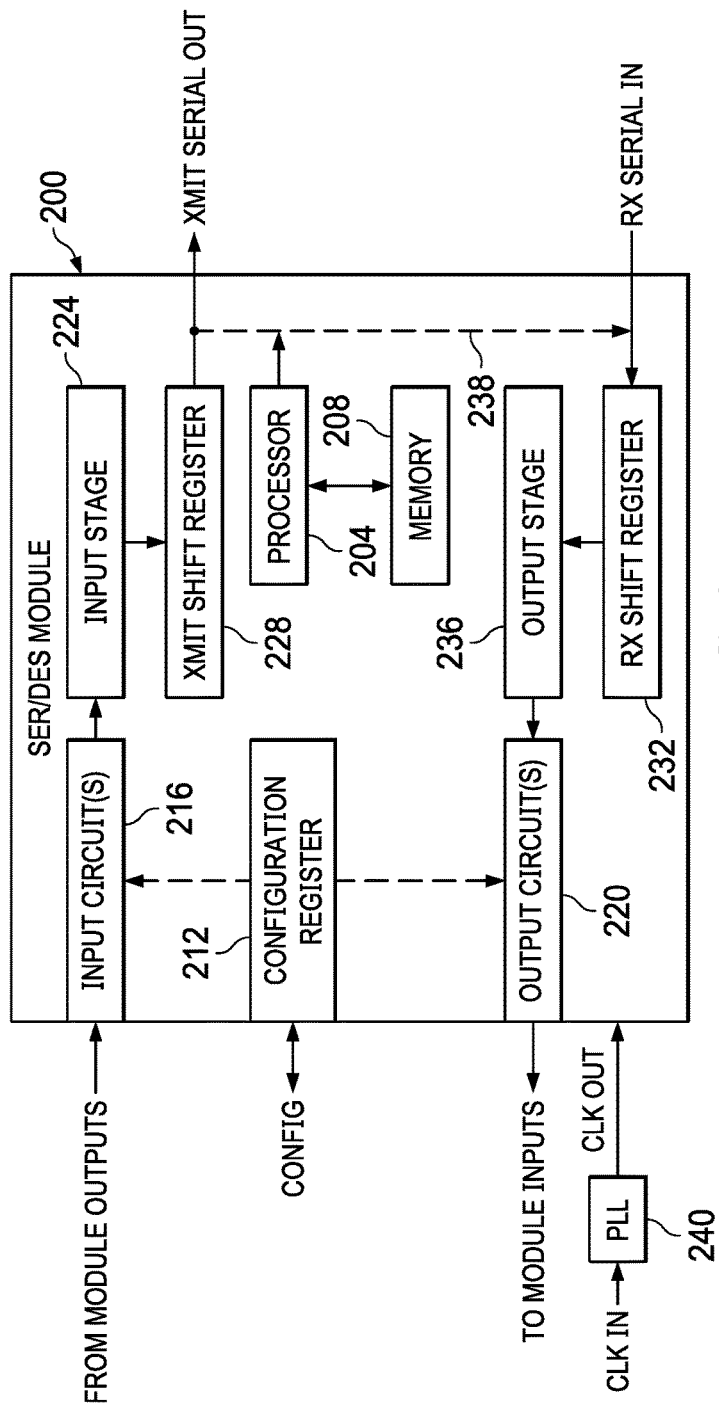
FIG. 2 illustrates an example of a serializer-deserializer (SER-DES) module for communicating signals between a motor controller module and a motor drive power module.
FIG. 3 illustrates an example of a time-formatted packet frame that is transmitted as a serial data stream by a serial-deserializer (SER-DES) module.

FIG. 2 illustrates an example of a SER-DES module 200 to reduce isolation circuitry between a motor controller module (e.g., module 104) and a motor drive power module (e.g., module 112). The SER-DES module 200 can be connected to either of the motor controller module or the motor drive power module for communicating signals across a galvanic barrier, as described herein. For example, the SER-DES module 200 can include a processor 204 and memory 208 to execute the respective SER-DES functionality described herein. In another example where a discrete processor and memory is not used, the SER-DES module 200 processing functions can be implemented as a state machine. The SER-DES module 200 includes a configuration register 212 to receive configuration input (CONFIG) that programs the SER-DES module. For example, the CONFIG input programs the number of controller module inputs and/or outputs to connect from the controller module if connected to the controller module, and the number of power module inputs and/or outputs to connect from the power module if connected to the power module. The configuration register 212 controls which controller/power module outputs are connected to input circuits 216 (e.g., buffers to store data) and which controller/power module inputs are connected to output circuits (e.g., drivers) which drive the module inputs. The configuration input to the configuration register 212 can be a bidirectional signal to enable verification of the configuration settings that are programmed.

The SER-DES module 200 includes an input stage 224 to encode data received from the input circuits 216 into an output serial data stream XMIT SERIAL OUT. A transmit shift register 228 is coupled to the input stage 224 to transmit the output serial data stream XMIT SERIAL OUT via the serial isolation channel described herein. A receive shift register 232 receives an input serial data stream RX SERIAL IN from the isolation channel described herein. An output stage 236 is coupled to the receive shift register 232 to decode the serial input data stream RX SERIAL IN and to provide parallel signals to the output circuits 220 that drive module inputs of the respective controller or power module. The input stage 224 encodes and formats a packet frame (see e.g., FIG. 3) that is to be communicated in the output serial data stream. As shown, a controllable loopback connection 238 can be provided between the transmit shift register 228 and the receive shift register 232 to enable diagnostics of communications for the SER-DES modules (e.g., to enable sending of test data packets and reading them back to determine if the same packets are received).

As an example, the packet frame includes data that specifies an edge location for a signal to begin at a given time period within the packet frame and an edge polarity that specifies a rising or falling edge for the signal at the edge location. The packet frame can be formatted according to a time division multiplexing (TDM) protocol in one example or a frequency division multiplexing (FDM) protocol in another example. A phased-locked loop (PLL) 240 can be provided to synchronize timing transmitted within the serial data streams communicated between the respective modules. The PLL 240 receives an input clock CLK IN from the respective controller or power module and generates an output clock CLK OUT to drive the SER-DES module 200.

FIG. 3 illustrates an example of a time-formatted packet frame 300 that is transmitted as a serial data stream by a SER-DES module. In this example, each of three pulse-width modulated (PWM) motor drive signals PWM1, PWM2, and PWM3 are sampled by a 500 MHz clock. This will provide an edge resolution of about 2 nsec. However, in other examples, other sampling times can be used. One serial signal SERIAL can be sampled by a 500/7=71.4 MHz clock providing edge resolution of about 14 nsec. For each signal, three bits are employed to specify where in the frame 300 and edge begins. For example, bit pattern 010 would specify the edge location for PWM1 in slot index 2 of the frame. Bit pattern 100 would indicate PWM2's edge would start at slot index 4 of the frame, and so forth. Each of the respective channels can also specify an edge polarity via a single extra bit per channel where a "0" can specify a falling edge and "1" can specify a rising edge for the signal specified in time via the slot index of the frame. Thus, in this example with three PWM channels and one serial channel, 10 bits are utilized to specify the edge locations for each of the respective channels within the frame 300 and 4 bits are utilized to specify the edge polarity for each channel within the frame. Other aspects can also be included within the packet frame 300. For example, the packet frame 300 can include an error detection and correction code to enable detection and correction of bit errors that occur in the input and/or output serial data stream. Also, the packet frame 300 can be compressed using a data compression protocol (e.g., run length encoding).

As a further example, the packet frame 300 can be transmitted at approximately 1 Gbps across the isolation boundary. A protocol can be developed across the two sides (e.g., using the serial channel) to coordinate and transmit low bit rate feedback and other general purpose input/output (GPIO) data. If the 14 bit frame is formatted in this example and transmitted, the latency will be about at least 28 nsec, but most likely less than about 50 nsec. When no edges exist to transmit, the polarity bits are redundant and could be used for exception processing, but an all zero transmission can be transmitted to conserve energy of the channel and reduce power when no edges exist. Even though the PWM signal could be approximately 100 KHz, frames can still exist where no bits are being transmitted. This achieves an example jitter target (e.g., +/−2 nsec), latency e.g., <50 nsec, and is power efficient.

FIGS. 4-8 illustrate example integrated circuit implementations based on grouping and serializing selected signals based on common signal paths within an isolation domain. As used herein, the term isolation domain refers to a phase of a motor that is driven by high and low side drivers via a high side drive PWM signal and a low side drive PWM signal, where each of the high and low side drivers represent a separate isolation domain for a given motor phase. In some examples, the high and low side drivers may be isolated from each other (e.g., non-common ground and power connections). In other examples, signals between phases may share a common ground and thus are not isolated with respect to each other. In these non-isolated examples, signals sharing a common ground can be serialized and deserialized, as described herein, to reduce overall isolation circuit requirements and silicon substrate costs. In some examples, associated signals (other than the PWM driver signals) within an isolation domain can be serialized and deserialized along with the respective PWM signals. These signals can include clocks, serial ADC channels to provide motor feedback, I/O signals, and status signals for example.

Figure 4:
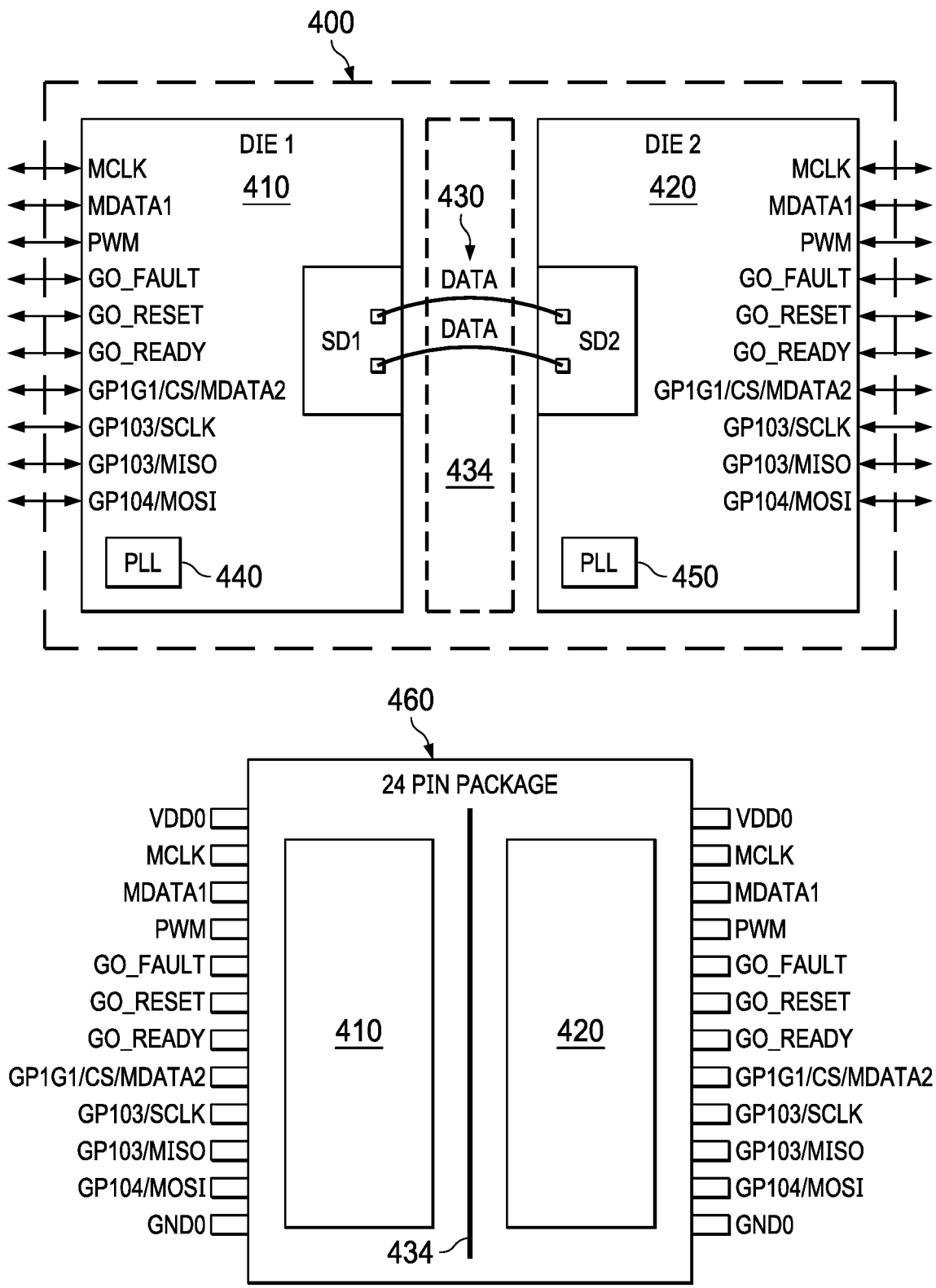
FIG. 4 illustrates a first example integrated circuit implementation based on grouping and serializing selected signals, and based on common signal paths within an isolation domain.

Referring to FIG. 4, a circuit 400 includes two integrated circuit dies 410 and 420 which are coupled via isolation channels 430 over an isolation barrier 434 to first and second SER-DES modules SD1 and SD2. A phase locked loop (PLL) 440 and 450 can be provided to synchronize timing for SD1 and SD2, respectively. Example control signals to be serialized and deserialized can include a clock (e.g., MCLK), data (e.g., MDATA), a PWM signal, fault, reset, and ready signals, along with general purpose I/O signals which can support a serial interface including an interface clock, serial input and output signals, and a chip select (CS) signal (e.g., ADC CS). The circuit 400 can be implemented for each high side and low side driver to drive a respective motor phase where each of the example control signals can be grouped with its associated driver signal. An example integrated circuit 460 having 24 pins and representing the circuit 400 is shown in FIG. 4, where the dies 410 and 420 are separated by isolation barrier 434.

Figure 5:
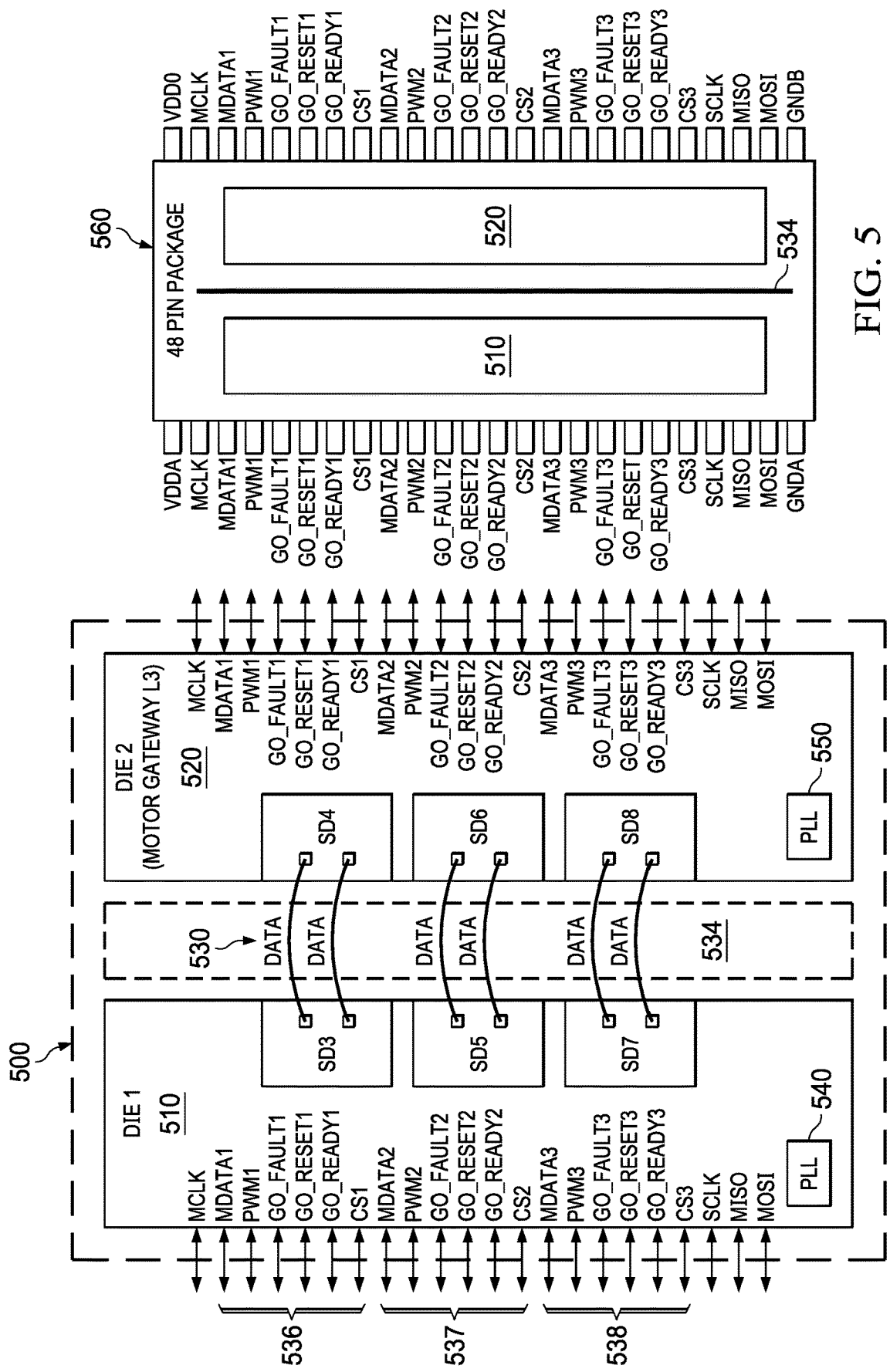
FIG. 5 illustrates a second example integrated circuit implementation based on grouping and serializing selected signals, and based on common signal paths within an isolation domain.

Referring to FIG. 5, a circuit 500 includes two integrated circuit dies 510 and 520 which are coupled via isolation channels 530 over an isolation barrier 534 via SER-DES module sets SD3/SD4, SD5/SD6, and SD7/SD8. The modules SD3/SD4 converts a first grouping of signals at 536, the modules SD5/SD6 converts a second grouping of signals at 537, and the modules SD7/SD8 converts a third grouping of signals at 538. Each of the signal groupings 536-538 are associated with a separate PWM signal. Other signals such as clocks and serial I/O signals can be grouped with one or more of the module sets SD3/SD4, SD5/SD6, and SD7/SD8. In this example, all low side drivers for each motor phase share a common ground and thus provide more signal groupings to serialize than the example shown in FIG. 4.

A phase locked loop (PLL) 540 and 550 can be provided in each die 510, 520 to synchronize timing of signals in the respective SER-DES modules. Similar to FIG. 4, example control signals to be serialized and deserialized for each SER-DES module set can include a clock (e.g., MCLK), data (e.g., MDATA), a PWM signal, fault, reset, and ready signals, along with general purpose I/O signals which can support a serial interface including an interface clock, serial input and output signals, and a chip select (CS) signal (e.g., ADC CS). The circuit 500 can be implemented to interface with all the low side drivers sharing a common ground path via a single integrated circuit implementation. An example integrated circuit implementation 560 having 48 pins is shown for the circuit 500.

Figure 6A:
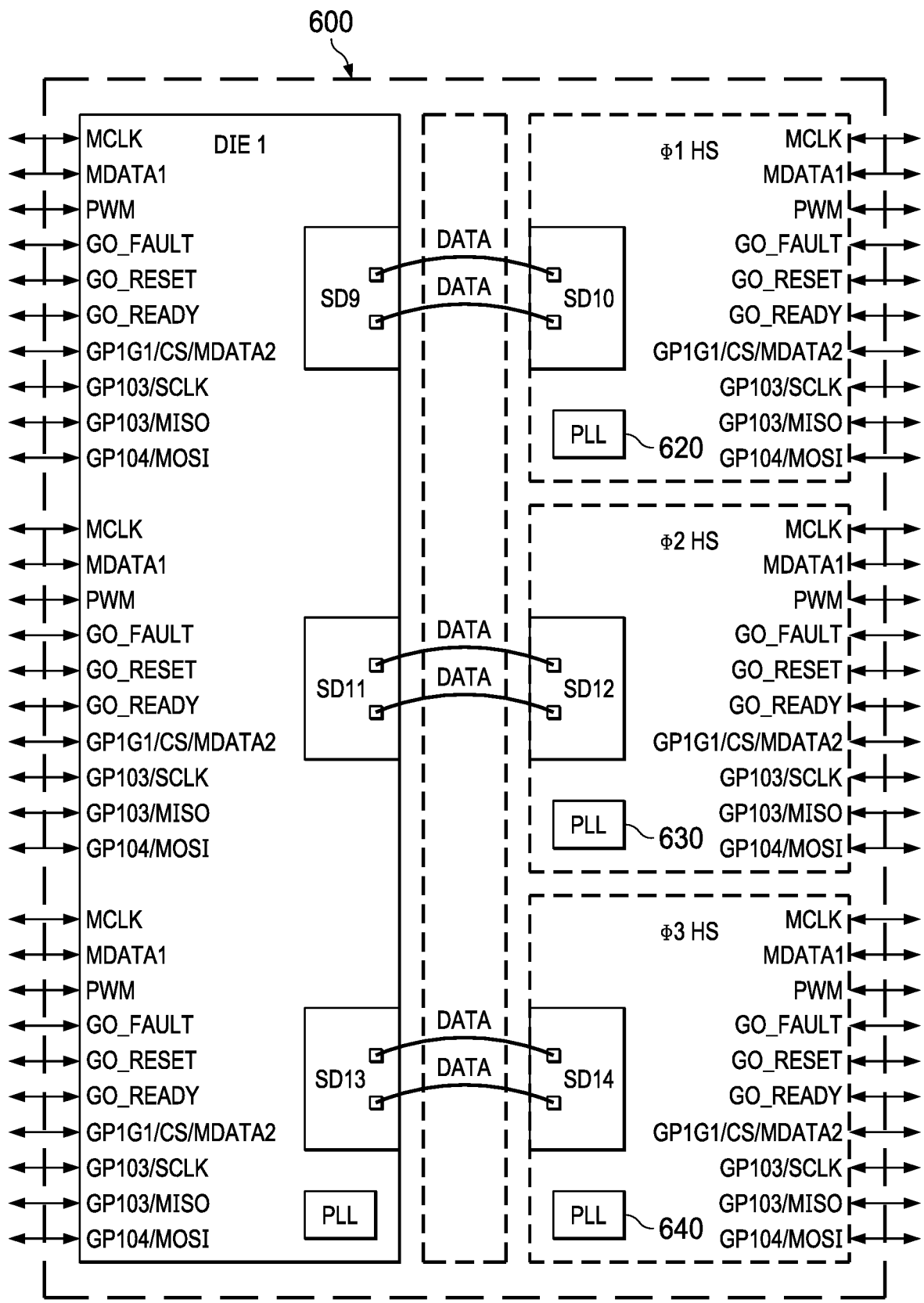
FIGS. 6A and 6B illustrate a third example integrated circuit implementation based on grouping and serializing selected signals, and based on common signal paths within an isolation domain.
Figure 6B:
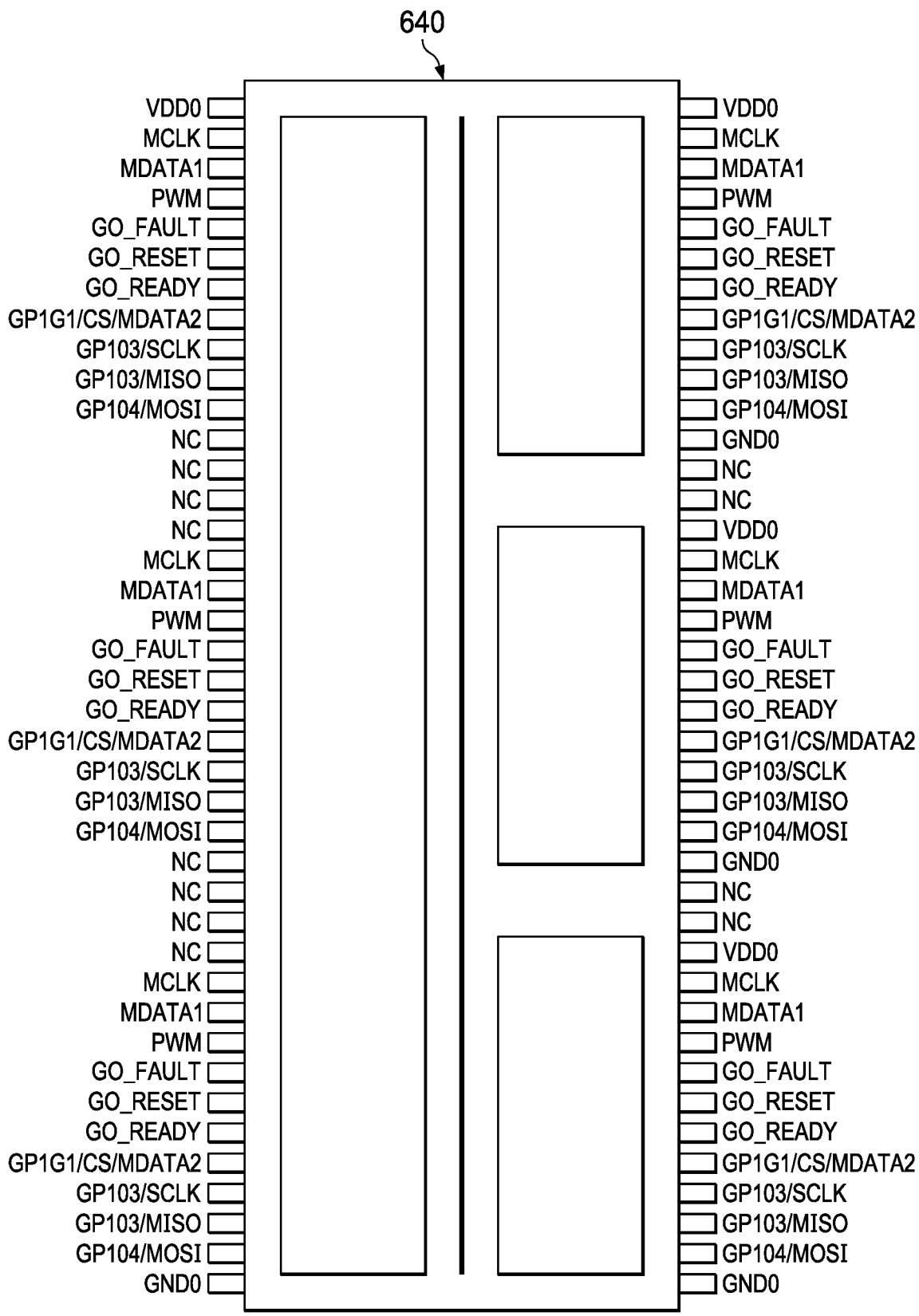

Referring to FIGS. 6A and 6B, an example circuit implementation 600 provides an integrated circuit to provide PWM drive to three high side drivers (or low side drivers if channel to channel isolation is desired for low-side as well) that are isolated from each other. In this example, SER-DES modules SD9/SD10 couple motor control signals to control a first high side phase, shown as φ1 HS. SER-DES modules SD11/SD12 couple motor control signals to control a second high side phase shown as φ2 HS. SER-DES modules SD13/SD14 couple motor control signals to control a third high side phase shown as φ3 HS. Separate phased locked loops 610, 620, and 630 can be implemented in each die to synchronize signals for the respective phases. An example integrated circuit implementation of the circuit 600 is shown at 640.

Figure 7:
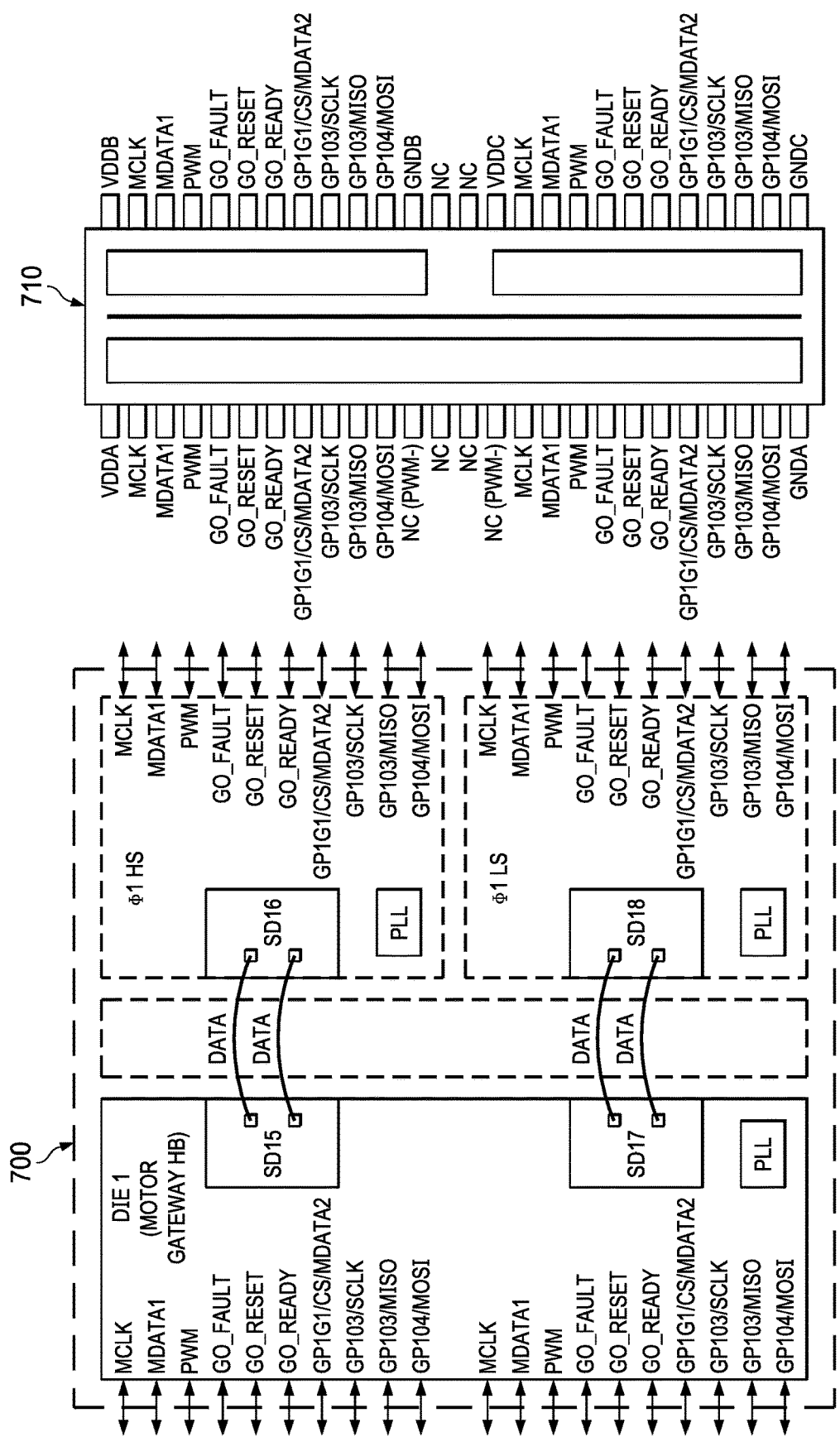
FIG. 7 illustrates a fourth example integrated circuit implementation based on grouping and serializing selected signals, and based on common signal paths within an isolation domain.

Referring FIG. 7, a circuit 700 can be provided to drive a high side and low side for a given phase of a three phase motor. In this example, SER-DES modules SD15/SD16 couple motor control signals to control a first high side phase shown as φ1 HS. SER-DES modules SD17/SD18 couple motor control signals to control a first low side phase shown as φ1 LS, where the high side and low side drivers share common ground on the controller side and are isolated with respect to each other on the power module side. For example, because the circuit 700 is configured to drive a single phase, three separate circuits of replicating the circuit 700 can be implemented to drive a three phase motor. An example integrated circuit implementation of the circuit 700 is shown at 710.

Figure 8:
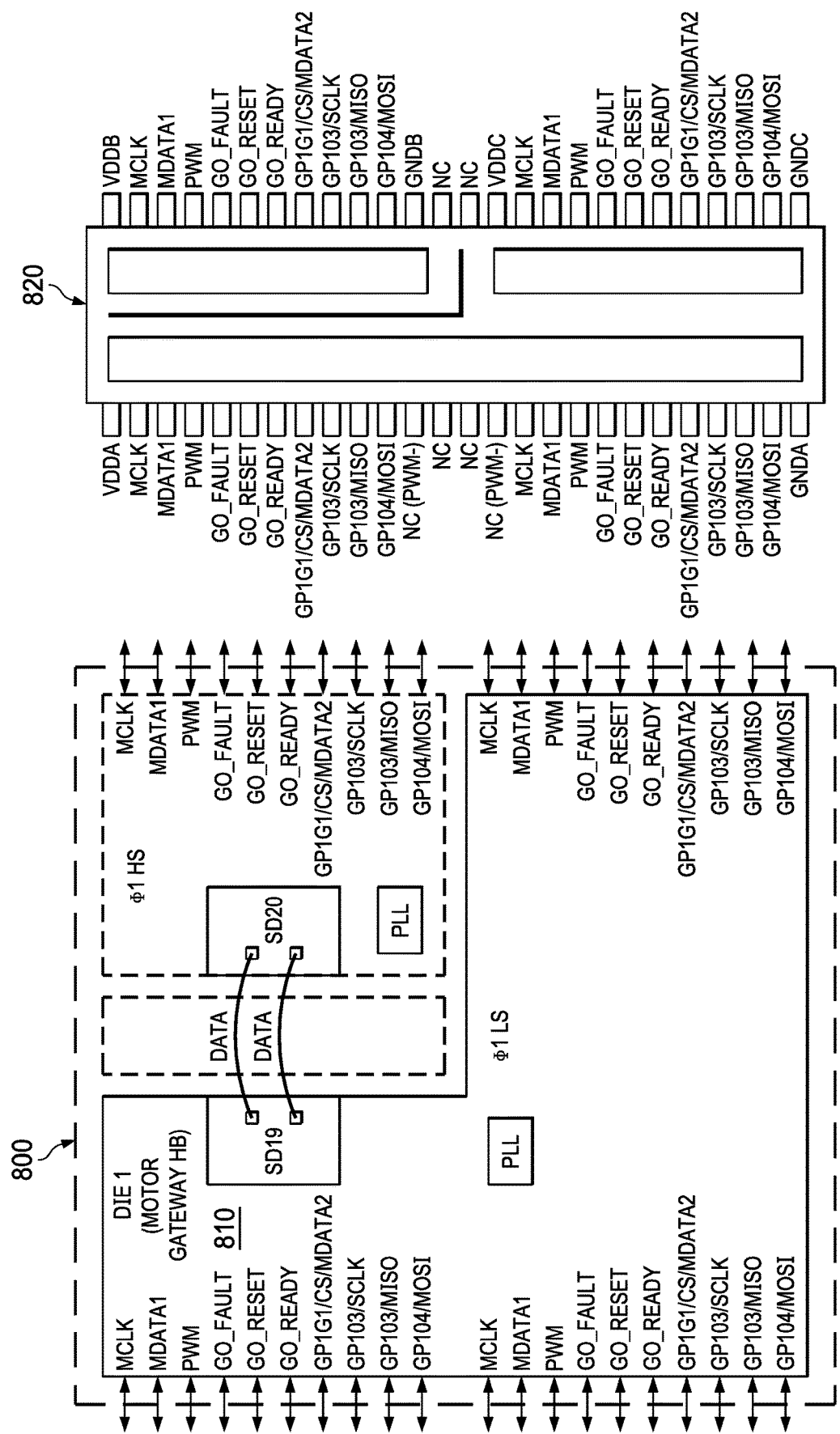
FIG. 8 illustrates a fifth example integrated circuit implementation based on grouping and serializing selected signals, and based on common signal paths within an isolation domain.

FIG. 8 illustrates an example implementation circuit 800 where all low side signals on the controller module side share a common ground path at 810 which is also shared with the power module side for the respective low side signals. Accordingly, the low side circuitry is not isolated. As shown, isolation can still be provided for the high side driver phase φ1 HS which communicates serialized signals via SER-DES modules SD19 and SD20. An example integrated circuit implementation of the circuit 800 is shown at 820.

In view of the foregoing structural and functional features described hereinabove, an example method is described with reference to FIG. 9. For simplicity of explanation, the method is shown and described as executing serially, but the method is not limited by the illustrated order, as parts of the method could occur in different orders and/or concurrently from that shown and described herein. Such method can be executed by various hardware circuits and components configured to execute machine readable instructions stored in memory and executable by an integrated circuit or a processor, for example.

Figure 9:
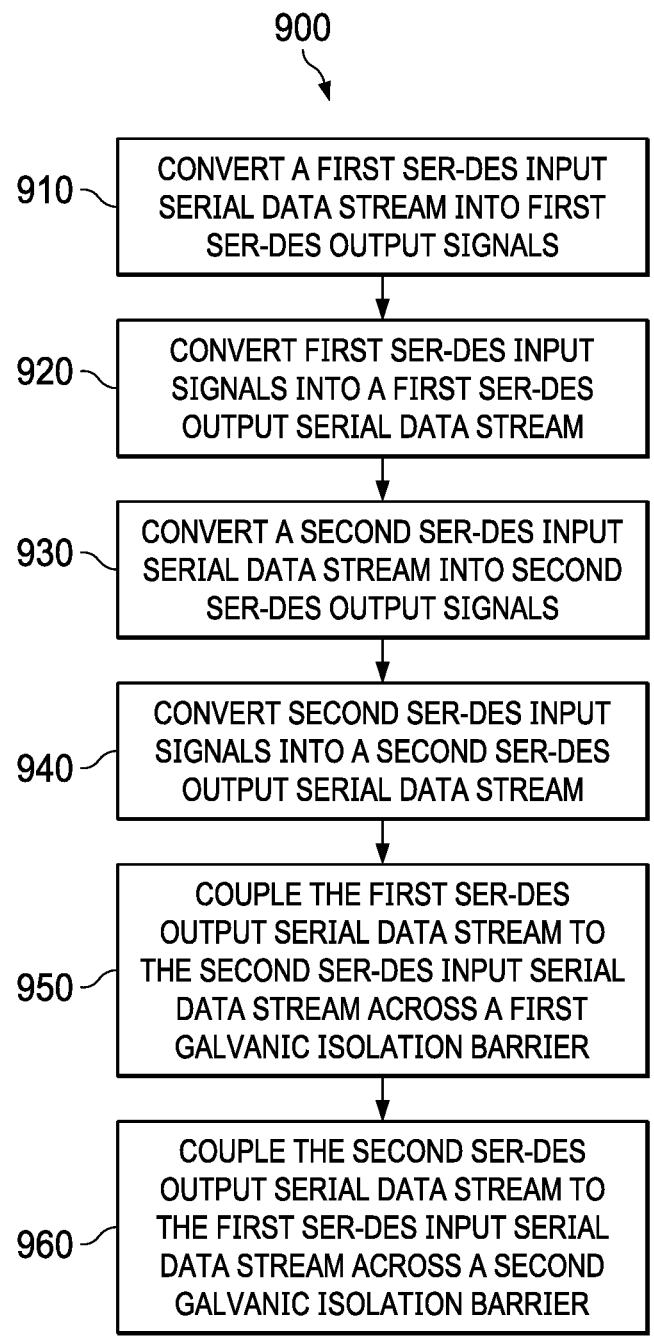
FIG. 9 illustrates an example method to communicate serial signals between a motor controller module and a motor drive power module.

FIG. 9 illustrates an example method 900 to communicate serial signals to between a motor controller module and a motor drive power module. At 910, the method 900 includes converting a first SER-DES input serial data stream into first SER-DES output signals. At 920, the method 900 includes converting first SER-DES input signals into a first SER-DES output serial data stream. At 930, the method 900 includes converting a second SER-DES input serial data stream into second SER-DES output signals. At 940, the method 900 includes converting second SER-DES input signals into a second SER-DES output serial data stream. At 950, the method 900 includes coupling the first SER-DES output serial data stream to the second SER-DES input serial data stream across a first galvanic isolation barrier to communicate control signals from a motor controller module to a motor drive power module to control a motor. At 960, the method 900 includes coupling the second SER-DES output serial data stream to the first SER-DES input serial data stream across a second galvanic isolation barrier to communicate feedback signals to the motor controller module from the motor drive power module relating to status of the motor. The method 900 can also include formatting a packet frame to be communicated in the output serial data stream, the packet frame includes data that specifies an edge location for a signal to begin at a given time period within the packet frame and an edge polarity that specifies a rising or falling edge for the signal at the edge location.

In this description, the term "based on" means based at least in part on. Modifications are possible in the described embodiments, and other embodiments are possible, within the scope of the claims.

What is claimed is:

1. A motor drive communication circuit, comprising:
   a first serializer-deserializer (SER-DES) having a first SER-DES input and a first SER-DES output, the first SER-DES configured to convert SER-DES input signals at the first SER-DES input into a SER-DES output serial data stream at the first SER-DES output, the SER-DES output serial data stream including a packet frame, and the packet frame including data specifying an edge location for a signal to begin within the packet frame and including an edge polarity specifying a rising or falling edge for the signal at the edge location;
   a second SER-DES having a second SER-DES input and a second SER-DES output, the second SER-DES output adapted to be coupled to motor phase driver circuitry; and
   a galvanic isolation barrier between the first SER-DES and the second SER-DES, the first SER-DES output coupled through the galvanic isolation barrier to the second SER-DES input, the second SER-DES configured to receive the SER-DES output serial data stream at the second SER-DES input and to convert the received SER-DES output serial data stream into SER-DES output signals at the second SER-DES output, the received SER-DES output serial data stream including the packet frame, and the packet frame including the data specifying the edge location for the signal to begin within the packet frame and including the edge polarity specifying the rising or falling edge for the signal at the edge location.

2. The motor drive communication circuit of claim 1, wherein:
   the first SER-DES includes a configuration register coupled to a configuration input of the first SER-DES; and
   the configuration input is configured to receive a configuration input signal to program the configuration register to specify a number of inputs or outputs of a controller to connect to the first SER-DES input.

3. The motor drive communication circuit of claim 2, wherein the configuration input signal is a bidirectional signal to enable verification of configuration settings that are programmed.

4. The motor drive communication circuit of claim 1, wherein:
   the first SER-DES includes an input stage; and
   the input stage is coupled to first SER-DES input and is configured to encode the SER-DES input signals received at the first SER-DES input into the SER-DES output serial data stream.

5. The motor drive communication circuit of claim 4, wherein:
   the first SER-DES includes a transmit shift register coupled to the input stage and coupled to the first SER-DES output; and
   the transmit shift register is configured to provide the SER-DES output serial data stream to the first SER-DES output.

6. The motor drive communication circuit of claim 5, wherein:
   the SER-DES input signals are first SER-DES input signals, and the SER-DES output serial data stream is a first SER-DES output serial data stream;
   the second SER-DES includes a third SER-DES input and a third SER-DES output;
   the second SER-DES is configured to convert second SER-DES input signals at the third SER-DES input into a second SER-DES output serial data stream;
   the galvanic isolation barrier is a first galvanic isolation barrier;
   the motor drive communication circuit further comprises a second galvanic isolation barrier between the first SER-DES and the second SER-DES;
   the first SER-DES includes a fourth SER-DES input and the third SER-DES output is coupled through the second galvanic isolation barrier to the fourth SER-DES input;
   the first SER-DES includes a receive shift register that is coupled to the fourth SER-DES input; and
   the receive shift register is configured to receive the second SER-DES output serial data stream.

7. The motor drive communication circuit of claim 6, wherein the first SER-DES includes a controllable loopback connection between the transmit shift register and the receive shift register and is configured to enable diagnostics of communications for the first SER-DES.

8. The motor drive communication circuit of claim 6, wherein:
   the first SER-DES includes a fourth SER-DES output and an output stage;
   the output stage is coupled to the receive shift register and to the fourth SER-DES output; and
   the receive shift register is configured to decode the second SER-DES serial output data stream and to provide second SER-DES output signals to the fourth SER-DES output.

9. The motor drive communication circuit of claim 4, wherein the input stage is configured to format the packet frame.

10. The motor drive communication circuit of claim 9, wherein the packet frame is formatted according to a time division multiplexing protocol or a frequency division multiplexing protocol.

11. The motor drive communication circuit of claim 9, wherein the packet frame includes an error detection and correction code to enable detection and correction of bit errors that occur in the SER-DES output serial data stream.

12. The motor drive communication circuit of claim 9, wherein the packet frame is compressed according to a data compression protocol.

13. The motor drive communication circuit of claim 1, wherein the first SER-DES includes a phased-locked loop to synchronize the SER-DES output serial data stream communicated between the first SER-DES to the second SER-DES by the galvanic isolation barrier.

14. The motor drive communication circuit of claim 1, wherein:
 each phase of the motor has a high side driver and low side driver to define isolation domains for each phase; and
 the high side driver and low side driver of at least one or more of the isolation domains share a common ground path.

15. The motor drive communication circuit of claim 1, wherein the first SER-DES, the second SER-DES and the galvanic isolation barrier are implemented on an integrated circuit substrate.

16. A motor drive system, comprising:
 a first serializer-deserializer (SER-DES) having a first SER-DES input, a second SER-DES input, a first SER-DES output, and a second SER-DES output, the first SER-DES configured to convert: a first SER-DES serial data stream at the first SER-DES input into first SER-DES output signals at the first SER-DES output, the first SER-DES serial data stream including a first packet frame, and the first packet frame including first data specifying a first edge location for a first signal to begin within the first packet frame and including a first edge polarity specifying a rising or falling edge for the first signal at the first edge location; or first SER-DES input signals at the second SER-DES input into a second SER-DES serial data stream at the second SER-DES output, the second SER-DES serial data stream including a second packet frame, and the second packet frame including second data specifying a second edge location for a second signal to begin within the second packet frame and including a second edge polarity specifying a rising or falling edge for the second signal at the second edge location;
 a second SER-DES having a third SER-DES input, a fourth SER-DES input, a third SER-DES output, and a fourth SER-DES output, the second SER-DES configured to convert: second SER-DES input signals at the third SER-DES input into the first SER-DES serial data stream at the third SER-DES output; or the second SER-DES serial data stream at the fourth input into second SER-DES output signals at the fourth output; and
 a galvanic isolation barrier between the first SER-DES and the second SER-DES the third SER-DES output coupled to the first SER-DES input through the galvanic isolation barrier and the second SER-DES output coupled to the fourth input through the galvanic isolation barrier, the galvanic isolation barrier configured to communicate the second SER-DES serial data stream across the galvanic isolation barrier from the second output to the fourth input for adapted to be coupled to motor phase driver circuitry and configured to communicate the first SER-DES serial data stream across the galvanic isolation barrier from third output to the first input for the motor phase driver circuitry.

17. The motor drive system of system of claim 16, wherein:
 the first SER-DES includes a first configuration register coupled to a first configuration input of the first SER-DES;
 the first configuration input is configured to receive a first configuration input signal to program the first configuration register to specify a number of inputs or outputs of a controller to connect to the first SER-DES;
 the second SER-DES includes a second configuration register coupled to a second configuration input of the second SER-DES;
 the motor phase driver circuitry includes motor driver power circuitry; and
 the second configuration input is configured to receive a second configuration input signal to program the second configuration register to specify a number of power inputs of the motor driver power circuitry or a number of power outputs of the motor driver power circuitry to connect to the second SER-DES.

18. The motor drive system of claim 16, wherein:
 the first SER-DES includes a first input stage coupled to the second SER-DES input;
 the first input stage is configured to encode the first SER-DES input signals received at the second SER-DES input into the second SER-DES serial data stream;
 the second SER-DES includes a second input stage coupled to the third SER-DES input; and
 the second input stage is configured to encode the second SER-DES input signals received at the third SER-DES input into the first SER-DES serial data stream.

19. The motor drive system of claim 18, wherein:
 the first SER-DES includes a first transmit shift register coupled to the first input stage and configured to provide the second SER-DES serial data stream at the second SER-DES output; and
 the second SER-DES includes a second transmit shift register coupled to the second input stage and configured to provide the first SER-DES serial data stream at the third SER-DES output.

20. The motor drive system of claim 19, wherein:
 the first SER-DES includes a first receive shift register coupled to first SER-DES input and configured to receive the first SER-DES serial data stream at the first SER-DES input; and
 the second SER-DES includes a second receive shift register coupled to the fourth SER-DES input and configured to receive the second SER-DES serial data stream at the fourth SER-DES input.

21. The motor drive system of claim 20, wherein:
 the first SER-DES includes a first output stage coupled to the first receive shift register and configured to decode the first SER-DES serial data stream to provide the first output signals to the first SER-DES output; and
 the second SER-DES includes a second output stage coupled to the second receive shift register and configured to decode the second SER-DES serial data stream to provide the second output signals to the fourth SER-DES output.

22. The motor drive system of claim 18, wherein the first input stage is configured to format the second packet frame.

23. A method, comprising:
 converting, at a first serializer-deserializer (SER-DES), first SER-DES input signals into a first SER-DES output serial data stream, the first SER-DES input signals including motor control signals;

converting, at a second SER-DES, the first SER-DES output serial data stream into second SER-DES output signals;
converting, at the second SER-DES, second SER-DES input signals provided by motor driver power circuitry into a second SER-DES output serial data stream, the second SER-DES input signals including motor status signals;
converting, at the first SER-DES, the second SER-DES output serial data stream into first SER-DES output signals;
communicating the first SER-DES output serial data stream across a first galvanic isolation barrier to communicate the control signals from the motor controller to the motor driver power circuitry;
communicating the second SER-DES output serial data stream across a second galvanic isolation barrier to communicate the motor status signals from the motor driver power circuitry to the motor controller; and
formatting a packet frame in each of the first and second SER-DES output serial data streams to be communicated respectively via the first and second galvanic isolation barriers, the packet frame including data specifying an edge location for a signal to begin within the packet frame and including an edge polarity specifying a rising or falling edge for the signal at the edge location.

* * * * *